United States Patent
Yang et al.

(10) Patent No.: US 11,026,026 B2
(45) Date of Patent: Jun. 1, 2021

(54) SENSING DEVICE

(71) Applicant: SILICON INTEGRATED SYSTEMS CORP., Hsinchu (TW)

(72) Inventors: Ssu-Che Yang, Hsinchu (TW); Wen-Chi Lin, Hsinchu (TW); Keng-Nan Chen, Hsinchu (TW)

(73) Assignee: SILICON INTEGRATED SYSTEMS CORP., Hsinchu (TW)

( * ) Notice: Subject to any disclaimer, the term of this patent is extended or adjusted under 35 U.S.C. 154(b) by 753 days.

(21) Appl. No.: 15/826,484

(22) Filed: Nov. 29, 2017

(65) Prior Publication Data

US 2018/0160233 A1 Jun. 7, 2018

(30) Foreign Application Priority Data

Dec. 2, 2016 (TW) .................................. 105140008

(51) Int. Cl.
*H04R 3/00* (2006.01)
*H04R 19/00* (2006.01)
*H04R 19/04* (2006.01)

(52) U.S. Cl.
CPC ............ *H04R 19/005* (2013.01); *H04R 3/00* (2013.01); *B81B 2201/0257* (2013.01); *H04R 19/04* (2013.01)

(58) Field of Classification Search
CPC ...... H04R 19/00; H04R 19/04; H04R 19/005; H04R 3/00; B81B 2201/0257; F16C 11/12; G01B 7/18; G01B 7/22; G01F 1/66; G01S 15/931; G01S 19/13
See application file for complete search history.

(56) References Cited

U.S. PATENT DOCUMENTS

| | | | |
|---|---|---|---|
| 2008/0042410 A1* | 2/2008 | Breed | B60R 21/017 280/735 |
| 2012/0121106 A1* | 5/2012 | Henriksen | H03F 3/45475 381/94.1 |
| 2015/0181352 A1* | 6/2015 | Astgimath | H04R 3/00 381/174 |
| 2015/0276405 A1* | 10/2015 | Rastegar | G01C 19/5776 73/504.12 |
| 2015/0276407 A1* | 10/2015 | Bhandari | G01C 19/5776 73/504.12 |
| 2016/0028306 A1* | 1/2016 | Lesso | H03G 3/30 381/107 |
| 2016/0360965 A1* | 12/2016 | Tran | A61B 8/00 |

* cited by examiner

*Primary Examiner* — Isam A Alsomiri
*Assistant Examiner* — Amie M Ndure
(74) *Attorney, Agent, or Firm* — Maschoff Brennan

(57) ABSTRACT

A sensing device comprises a charge pump, a MEMS sensor, a source follower and a PGA. The charge pump is configured to provide a pump voltage. The MEMS sensor is electrically connected to the charge pump and configured to generate an input voltage according to environment variations. The source follower is electrically connected to the MEMS sensor and configured to generate a followed reference voltage according to the pump voltage and to generate a followed input voltage according to the input voltage. The PGA has an input end of the PGA electrically connected to the source follower and is configured to generate two-ended differential output voltages outputted through a first output end and a second output end according to a difference between the followed reference voltage and the followed input voltage.

14 Claims, 3 Drawing Sheets

SENSING DEVICE

CROSS-REFERENCE TO RELATED APPLICATIONS

This non-provisional application claims priority under 35 U.S.C. § 119(a) on Patent Application No(s). 105140008 filed in Taiwan, R.O.C. on Dec. 2, 2016, the entire contents of which are hereby incorporated by reference.

TECHNICAL FIELD

This disclosure relates to a sensing device, and more particularly to a sensing device having a source follower with two-ended output.

BACKGROUND

Micro Electro Mechanical System (MEMS) is an industrial technology integrated with micro-electronic technology and mechanical engineering. A MEMS device generally ranges in size from micrometer to millimeter scale, and is manufactured in a way similar to semi-conductor manufacture with processes like calendaring, electroplating, wet etching, dry etching and electrical discharge machining.

Generally, a MEMS device includes a source follower and a PGA (programmable gain amplifier) for signal gain adjustment and transmission impedance adjustment. However, in the past, a source follower implemented in a MEMS device has single ended output only. As a result, the PSRR (power supply rejection ratio) of the PGA in a MEMS device is hard to be improved.

SUMMARY

One embodiment of the disclosure provides a sensing device. The sensing device comprises a charge pump, a MEMS sensor, a source follower and a PGA. The charge pump is configured to provide a pump voltage. The MEMS sensor is electrically connected to the charge pump and configured to generate an input voltage according to environment variations. The source follower is electrically connected to the MEMS sensor and configured to generate a followed reference voltage according to the pump voltage and to generate a followed input voltage according to the input voltage. The PGA has an input end of the PGA electrically connected to the source follower and is configured to generate two-ended differential output voltages outputted through a first output end and a second output end according to a difference between the followed reference voltage and the followed input voltage.

BRIEF DESCRIPTION OF THE DRAWINGS

The present disclosure will become better understood from the detailed description given hereinbelow and the accompanying drawings which are given by way of illustration only and thus are not limitative of the present disclosure and wherein.

DETAILED DESCRIPTION

Figure 1:
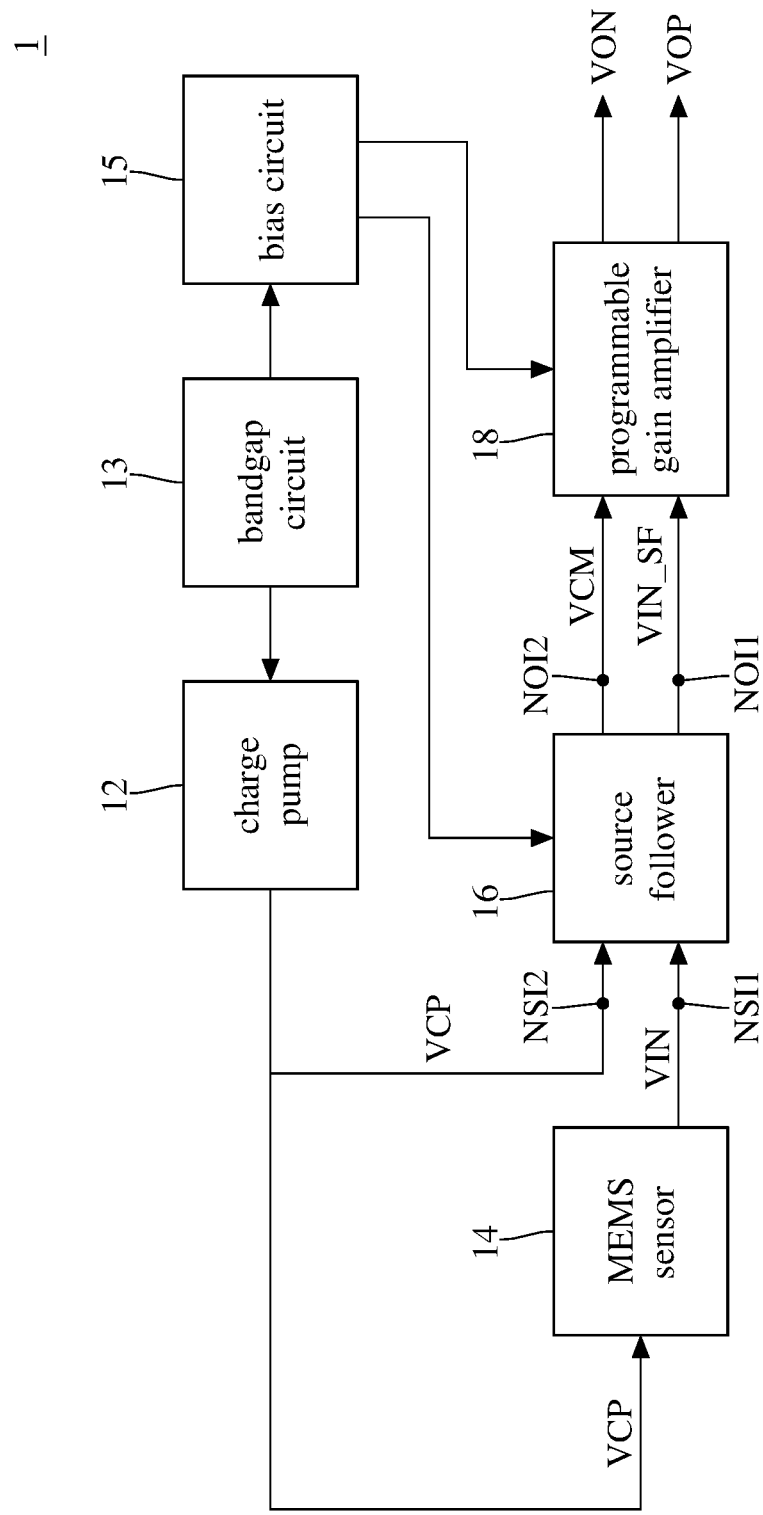
FIG. 1 is a function block diagram of a sensing device in an embodiment of this disclosure.

Please refer to FIG. 1. FIG. 1 is a function block diagram of a sensing device in an embodiment of this disclosure. The sensing device comprises a charge pump 12, a MEMS sensor 14, a source follower 16 and a programmable gain amplifier 18 (PGA). The MEMS sensor 14 is electrically connected to the charge pump 12. The source follower 16 is electrically connected to the MEMS sensor 14. An input end of the PGA 18 is electrically connected the source follower 16.

The charge pump 12 is configured to provide a pump voltage VCP. The MEMS sensor 14 is configured to generate an input voltage VIN according to environment variations and the pump voltage VCP. In one embodiment, the MEMS sensor has a nature status and a sensing status. When the MEMS sensor is in the nature status, the MEMS sensor has an equivalent capacitance corresponding to the nature status. In one embodiment, the MEMS sensor 14 is configured to sense audio. When the MEMS sensor 14 does not serve as an audio receiver, the MEMS sensor 14 is in the nature status and has the said equivalent capacitance. When the MEMS sensor 14 is in the use for audio reception, the MEMS sensor 14 is in the sensing status, and the equivalent capacitance varies with the received audio. The following embodiment exemplified with that the MEMS sensor 14 is used for audio sensing but not limited to audio sensing.

The source follower 16 has a first input end NSI1, a second input end NSI2, a first output end NOI1 and a second output end NOI2. The first input end NSI1 is configured to receive an input voltage VIN. The second input end NSI2 is configured to receive a pump voltage VCP. The source follower 16 is configured to generate a followed input voltage VIN_SF at the first output end NOI1. The source follower 16 is configured to generate a followed reference voltage VCM according to the pump voltage VCP at the second output end NOI2.

The PGA 18 has two input ends and two output ends. The two input ends are respectively and electrically connected to the first output end NOI1 and the second output end NOI2 of the source follower. The PGA generates an output voltage VON and an output voltage VOP according to the followed input voltage VIN_SF and followed reference voltage VCM.

In practice, the sensing device 1 may comprise a bandgap circuit 13 and a bias generation circuit 15. The bandgap circuit 13 is electrically connected to the charge pump 12 and the bias generation circuit 15. The bias generation circuit 15 is electrically connected to the source follower 16 and the PGA 18. The bandgap circuit is configured to provide a relatively accurate system reference voltage to the charge pump 12 and the bias generation circuit 15. The charge pump 12 is configured to generate the pump voltage VCP according to the system reference voltage. The bias generation circuit 15 is configured to provide voltages to the source follower 16 and the PGA 18 according to the system reference voltage. Practical details relative to the bandgap circuit 13 and the bias generation circuit 15 can be altered according to practical needs by a person has ordinary skill in the art and is not repeated herein.

Figure 2:
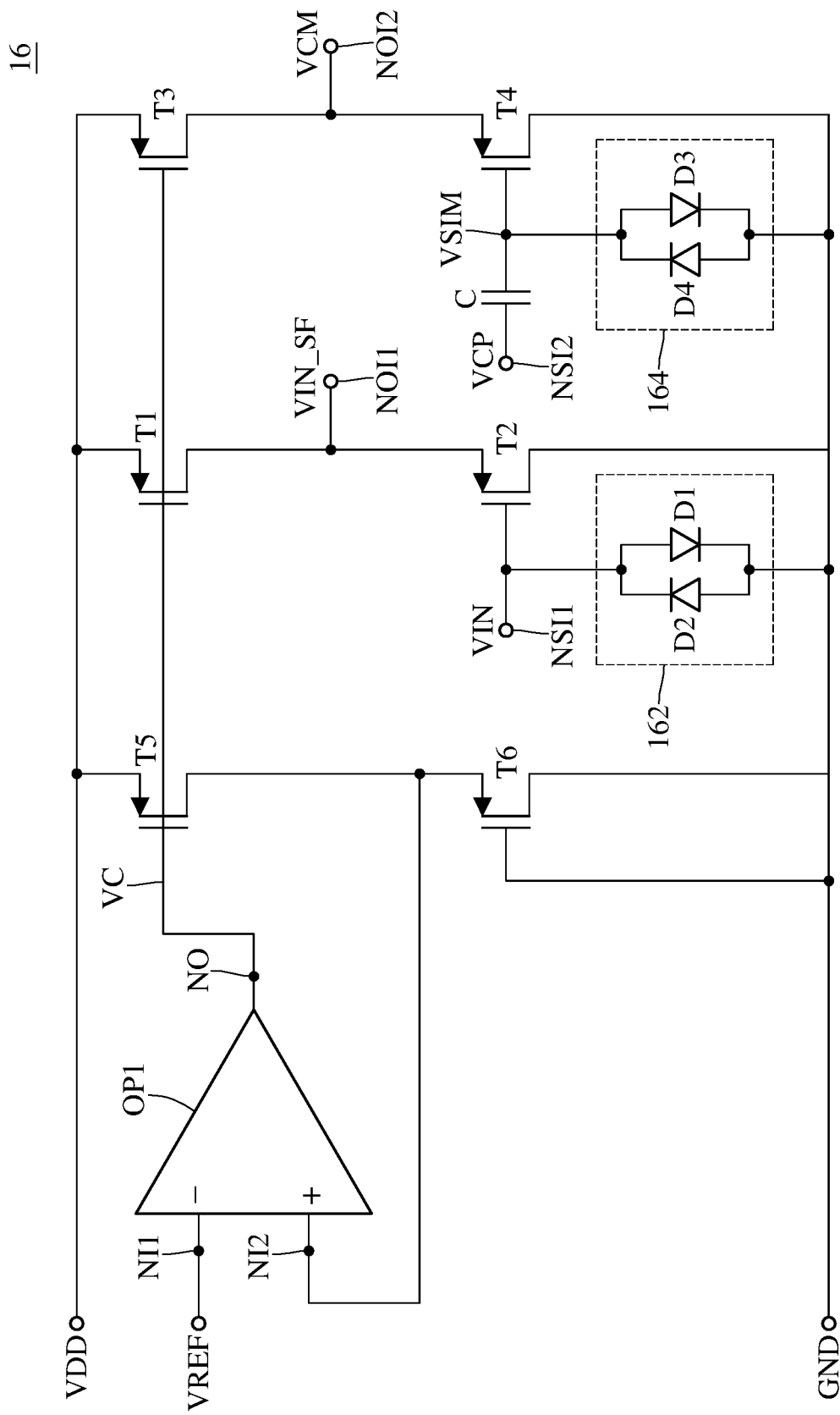
FIG. 2 is a schematic diagram of a source follower in an embodiment of this disclosure.

Please refer to FIG. 2 illustrating the source follower 16 with more details, wherein FIG. 2 is a schematic diagram of a source follower in an embodiment of this disclosure. As shown in FIG. 2, the source follower 16 has at least a first transistor T1, a second transistor T2, a third transistor T3 and a fourth transistor T4. A first end of the first transistor T1 is configured to receive a first standard voltage VDD. A second end of the first transistor T1 is electrically connected to the first output end NOI1. A control end of the first transistor T1 is configured to receive a control voltage VC. A first end of the second transistor T2 is electrically connected to the second end of the first transistor T1. A second end of the second transistor T2 is configured to receive a second standard voltage GND. A control end of the second transistor T2 is configured to receive the input voltage VIN. A first end of the third transistor T3 is configured to receive the first standard voltage VDD. A second end of the third transistor T3 is electrically connected to the second output end. A control end of the third transistor T3 is configured to receive the control voltage VC. A first end of the fourth transistor T4 is electrically connected the second end of the third transistor T3. A second end of the fourth transistor T4 is configured to receive the second standard voltage GND. A control end of the fourth transistor T4 is configured to receive a simulation voltage VSIM.

The simulation voltage VSIM corresponds to an output voltage, with said output voltage generated by the MEMS sensor 14 according to the pump voltage VCP. The first transistor, the second transistor, the third transistor and the fourth transistor are all N-type MOSFETs or are all P-type MOSFETs. In this embodiment, the first standard voltage VDD may be a relatively high level voltage in the system, and the second standard voltage VDD may be a relatively low level voltage in the system, wherein the first standard voltage VDD is higher than the second standard voltage GND.

In the embodiment of FIG. 2, the source follower 16 has a capacitor C. The first end of the capacitor C is electrically connected to the control end of the fourth transistor T4. The second end of the capacitor C is configured to receive a pump voltage VCP. Based on the coupling of the pump voltage VCP, the simulation voltage VSIM is generated at the first end of the capacitor C. As mentioned previously, the MEMS sensor 14 has the nature status and the sensing status. A capacitance of the capacitor C is equal to the equivalent capacitance of the MEMS sensor 14 when the MEMS sensor 14 is in the nature status.

In the embodiment of FIG. 2, the source follower 16 comprises a fifth transistor T5 and a sixth transistor T6. A first end of the fifth transistor T5 is configured to receive the first standard voltage VDD. A second end of the fifth transistor T5 is configured to receive a circuit reference voltage VREF. The control end of the fifth transistor T5 is configured to receive the control voltage VC. A first end of the sixth transistor T6 is configured to receive the circuit reference voltage VREF. A second end of the sixth transistor T6 is configured to receive the second standard voltage GND. The control end of the sixth transistor T6 is configured to receive the second standard voltage GND. The sixth transistor T6 is served as a current source, generating corresponding current according to the circuit reference voltage VREF and the second standard voltage GND. The fifth transistor T5 is configured to form a current mirror together with the first transistor T1 and the third transistor T3, wherein the current mirror is configured to map the current flowing through the sixth transistor T6 to the transistor T1 and to the transistor T3 with appropriate proportion.

An aspect ratio of the first transistor T1 is larger than an aspect ratio of the fifth transistor T5. An aspect ratio of the third transistor T3 is larger than the aspect ratio of the fifth transistor T5. The aspect ratio of the first transistor T1 is equal to the aspect ratio of the third transistor T3. In another embodiment, the aspect ratio of the first transistor T1 is an integer multiple of the aspect ratio of the fifth transistor T5. The aspect ratio of the third transistor T3 is an integer multiple of the aspect ratio of the fifth transistor T5. The relationship between the aspect ratios of the first transistor T1, the third transistor T3 and the fifth transistor T5 can be adjusted by a person having ordinary skills in the art in accordance with this disclosure, and is not limited thereto.

Furthermore, in the embodiment of FIG. 2, the source follower 16 comprises an operation power amplifier OP1. The operation power amplifier OP1 comprises a first input end NI1, a second input end NI2, and an output end NO. The first input end NI1 of the operation power amplifier OP1 is configured to receive the circuit reference voltage VREF. The second input end NI2 of the operation power amplifier OP1 is electrically connected to the second end of the fifth transistor T5 and the first end of the sixth transistor T6. The output end NO of the operation power amplifier OP1 is electrically connected to the control ends of the first, third, and fifth transistors T1, T3, T5. Because of the "virtual short circuit" characteristic of the operation power amplifier OP1, the circuit reference voltage VREF is provided to the second end of the fifth transistor T5 and the first end of the sixth transistor T6.

Moreover, the source follower 16 comprises a first bias circuit 162 and a second bias circuit 164. One end of the first bias circuit 162 is electrically connected the control end of the second transistor T2. The other end of the first bias circuit 162 is configured to receive the second standard voltage GND. One end of the second bias circuit 164 is electrically connected the control end of the fourth transistor T4. The other end of the second bias circuit 164 is configured to receive the second standard voltage GND. It should be noticed that the first bias circuit 162 and the second bias circuit 164 are optional to the sensing device 1, which means that it is not definitely necessary to dispose the first bias circuit 162 and the second bias circuit 164 in the source follower 16. When the first bias circuit 162 and the second bias circuit 164 are disposed in the source follower 16 by the way of FIG. 2, the control end of the second transistor T2 will not be impacted by a voltage excessing a default range, or the control end of the fourth transistor T4 will not be impacted by a voltage excessing a default range.

In this embodiment, the first bias circuit 162 comprises a first diode D1 and a second diode D2. The second bias circuit 164 comprises a third diode D3 and a fourth diode D4. An anode of the first diode D1 and a cathode of the second diode D2 are electrically connected to the control end of the second transistor T2 respectively. A cathode of the first diode D1 and an anode of the second diode D2 are configured to receive the second standard voltage GND. An anode of the third diode D3 and a cathode of the fourth diode D4 are electrically connected to the control end of the fourth transistor T1. A cathode of the third diode D3 and an anode of the fourth diode D4 are configured to receive the second standard voltage GND. The first diode D1, the second diode D2, the third diode D3 and the fourth diode D4 may be poly-silicon diodes.

Figure 3:
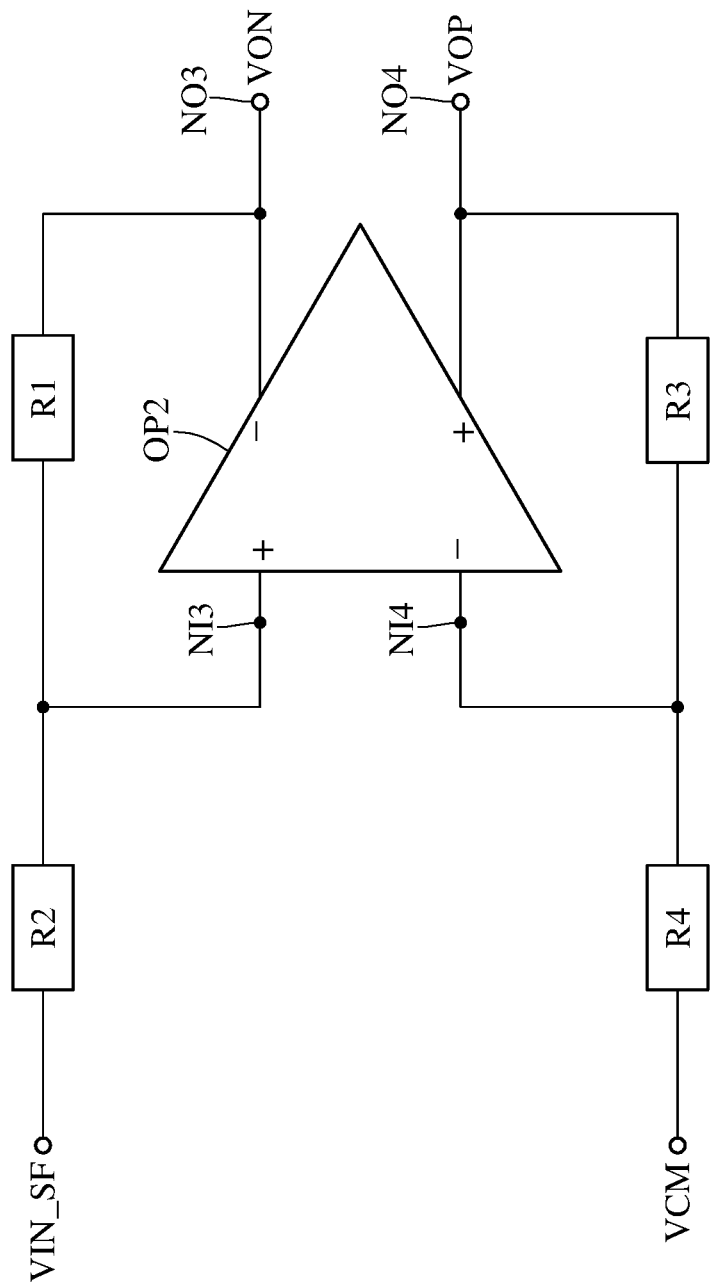
FIG. 3 is a schematic diagram of a PGA in an embodiment of this disclosure.

Please refer to FIG. 3, wherein FIG. 3 is a schematic diagram of a PGA in an embodiment of this disclosure. The PGA 18 comprises an operation power amplifier OP2 and resistors R1~R4. The operation power amplifier OP2 has a first input end NI3, a second input end NI4, a first output end NO3 and a second output end NO4. Two ends of the resister R1 are respectively and electrically connected to the first input end NI3 and the first output end NO3. Two ends of the resistor R3 are respectively and electrically connected to the second input end NI4 and the second output end NO4. One end of the resistor R2 is electrically connected to the first input end NI3, the other end of the resistor R2 is configured to receive the followed input voltage VIN_SF. One end of the resistor R4 is electrically connected to the second input end NI4. The other end of the resistor R4 is configured to receive the followed reference voltage VCM.

The PGA 18 generates the first output voltage VON at the first output end NO3 according to the followed input voltage VIN_SF and the followed reference voltage. The PGA 18 generates the second output voltage VOP at the second output end NO4 according to the followed input voltage VIN_SF and the followed reference voltage VCM. In this embodiment, the resistance of the resistor R1 is equal to the resistance of the resistor R3, and the resistance of the resistor R2 is equal to the resistance of the resistor R4.

In view of the above description, this disclosure provides a sensing device. The sensing device comprises at least a source follower and a PGA. The source follower has two output ends and the PGA has two output ends, wherein one output voltage at one of the output ends of the source follower is generated according to a pump voltage. In one embodiment, the pump voltage is the voltage provided by the charge pump, and a common mode voltage is thus obtained with a capacitor having the same capacitance as the equivalent capacitance of the MEMS sensor. Thus, the mentioned circuit has higher PSRR accordingly.

What is claimed is:

1. A sensing device comprises:
 a charge pump configured to provide a pump voltage;
 a MEMS sensor electrically connected to the charge pump and configured to generate an input voltage according to environment variations;
 a source follower electrically connected to the MEMS sensor and the charge pump and configured to generate a followed reference voltage at a first output end according to the pump voltage and to generate a followed input voltage at a second output end according to the input voltage; and
 a programmable gain amplifier, with two input ends of the programmable gain amplifier electrically connected to the first and the second output ends of the source follower respectively and configured to generate two-ended differential output voltages according to a difference between the followed reference voltage and the followed input voltage.

2. The sensing device according to claim 1, wherein the source follower comprises:
 a first transistor, with a first end of the first transistor configured to receive a first standard voltage, a second end of the first transistor electrically connected to the first output end and a control end of the first transistor configured to receive a control voltage;
 a second transistor, with a first end of the second transistor electrically connected to the second end of the first transistor, a second end of the second transistor configured to receive a second standard voltage and a control end of the second transistor configured to receive the input voltage;
 a third transistor, with a first end of the third transistor configured to receive a first standard voltage, a second end of the third transistor electrically connected to the second output end and a control end of the third transistor configured to receive the control voltage; and
 a fourth transistor, with a first end of the fourth transistor electrically connected to the second end of the third transistor, a second end of the fourth transistor configured to receive the second standard voltage and the control end of the fourth transistor configured to receive a simulation voltage;
 wherein the simulation voltage corresponds to an output voltage generated by the MEMS sensor according to the pump voltage and wherein the first transistor, the second transistor, the third transistor and the fourth transistor are all N-type MOSFETs or are all P-type MOSFETs.

3. The sensing device according to claim 2, wherein the control end of the fourth transistor is electrically connected to one end of a capacitor, and another end of the capacitor is configured to receive the pump voltage;
 wherein, the MEMS sensor has a nature status and a sensing status and has an equivalent capacitance when the MEMS sensor is in the nature status, and a capacitance of the capacitor is equal to the equivalent capacitance.

4. The sensing device according to claim 2, wherein the source follower comprises a first bias circuit, with one end of the first bias circuit electrically connected to the control end of the second transistor and with another end of the first bias circuit configured to receive the second standard voltage, and wherein the source follower further comprises a second bias circuit, with one end of the second bias circuit electrically connected to the control end of the fourth transistor and with another end of the second bias circuit configured to receive the second standard voltage.

5. The sensing device according to claim 4, wherein the first bias circuit comprises a first diode and a second diode and the second bias circuit comprises a third diode and a fourth diode, with an anode of the first diode and a cathode of the second diode electrically connected to the control end of the second transistor, and with a cathode of the first diode and an anode of the second diode configured to receive the second standard voltage, and with an anode of the third diode and a cathode of the fourth diode electrically connected to the control end of the fourth transistor, and with a cathode of the third diode and an anode of the fourth diode configured to receive the second standard voltage.

6. The sensing device according to claim 5, wherein the first diode, the second diode, the third diode and the fourth diode are poly-silicon diodes.

7. The sensing device according to claim 2, wherein the source follower comprises a fifth transistor and a sixth transistor, with a first end of the fifth transistor configured to receive the first standard voltage, and with a second end of the fifth transistor configured to receive a circuit reference voltage and with the control end of the fifth transistor configured to receive the control voltage, and with a first end of the sixth transistor configured to receive the circuit reference voltage, and with a second end of the sixth transistor configured to receive the second standard voltage and with the control end of the sixth transistor configured to receive the second standard voltage.

8. A sensing device, comprising:
 a charge pump configured to provide a pump voltage;
 a MEMS sensor electrically connected to the charge pump and configured to generate an input voltage according to environment variations;
 a source follower electrically connected to the MEMS sensor and configured to generate a followed reference voltage according to the pump voltage and to generate a followed input voltage according to the input voltage; and
 a programmable gain amplifier, with an input end of the programmable gain amplifier electrically connected to the source follower and configured to generate two-ended differential output voltages outputted through a first output end and a second output end according to a difference between the followed reference voltage and the followed input voltage;

wherein the source follower comprises:
- a first transistor, with a first end of the first transistor configured to receive a first standard voltage, a second end of the first transistor electrically connected to the first output end and a control end of the first transistor configured to receive a control voltage;
- a second transistor, with a first end of the second transistor electrically connected to the second end of the first transistor, a second end of the second transistor configured to receive a second standard voltage and a control end of the second transistor configured to receive the input voltage;
- a third transistor, with a first end of the third transistor configured to receive a first standard voltage, a second end of the third transistor electrically connected to the second output end and a control end of the third transistor configured to receive the control voltage;
- a fourth transistor, with a first end of the fourth transistor electrically connected to the second end of the third transistor, a second end of the fourth transistor configured to receive the second standard voltage and the control end of the fourth transistor configured to receive a simulation voltage;
- a fifth transistor, with a first end of the fifth transistor configured to receive the first standard voltage, and with a second end of the fifth transistor configured to receive a circuit reference voltage and with the control end of the fifth transistor configured to receive the control voltage; and
- a sixth transistor, with a first end of the sixth transistor configured to receive the circuit reference voltage, and with a second end of the sixth transistor configured to receive the second standard voltage and with the control end of the sixth transistor configured to receive the second standard voltage;
- wherein the simulation voltage corresponds to an output voltage generated by the MEMS sensor according to the pump voltage and wherein the first transistor, the second transistor, the third transistor and the fourth transistor are all N-type MOSFETs or are all P-type MOSFETs, an aspect ratio of the first transistor is larger than an aspect ratio of the fifth transistor, and an aspect ratio of the third transistor is larger than the aspect ratio of the fifth transistor, and the aspect ratio of the first transistor is equal to the aspect ratio of the third transistor.

9. The sensing device according to claim 8, wherein the aspect ratio of the first transistor is an integer multiple of the aspect ratio of the fifth transistor, and the aspect ratio of the third transistor is an integer multiple of the aspect ratio of the fifth transistor.

10. The sensing device according to claim 8, wherein the control end of the fourth transistor is electrically connected to one end of a capacitor, and another end of the capacitor is configured to receive the pump voltage;
- wherein, the MEMS sensor has a nature status and a sensing status and has an equivalent capacitance when the MEMS sensor is in the nature status, and a capacitance of the capacitor is equal to the equivalent capacitance.

11. The sensing device according to claim 8, wherein the source follower comprises a first bias circuit, with one end of the first bias circuit electrically connected to the control end of the second transistor and with another end of the first bias circuit configured to receive the second standard voltage, and wherein the source follower further comprises a second bias circuit, with one end of the second bias circuit electrically connected to the control end of the fourth transistor and with another end of the second bias circuit configured to receive the second standard voltage.

12. The sensing device according to claim 11, wherein the first bias circuit comprises a first diode and a second diode and the second bias circuit comprises a third diode and a fourth diode, with an anode of the first diode and a cathode of the second diode electrically connected to the control end of the second transistor, and with a cathode of the first diode and an anode of the second diode configured to receive the second standard voltage, and with an anode of the third diode and a cathode of the fourth diode electrically connected to the control end of the fourth transistor, and with a cathode of the third diode and an anode of the fourth diode configured to receive the second standard voltage.

13. The sensing device according to claim 12, wherein the first diode, the second diode, the third diode and the fourth diode are poly-silicon diodes.

14. The sensing device according to claim 8, wherein the source follower comprises an operation power amplifier, with an first input end of the operation power amplifier configured to receive the circuit reference voltage, and with a second input end of the operation power amplifier electrically connected to the second end of the fifth transistor and the first end of the sixth transistor, and with an output end of the operation power amplifier electrically connected to the control end of the fifth transistor, the control end of the first transistor and the control end of the third transistor.

* * * * *